(12) United States Patent
Hsu

(10) Patent No.: US 7,084,033 B2
(45) Date of Patent: Aug. 1, 2006

(54) METHOD FOR FABRICATING A TRENCH POWER MOSFET

(75) Inventor: Hsiu-Wen Hsu, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 0 days.

(21) Appl. No.: 10/906,140

(22) Filed: Feb. 4, 2005

(65) Prior Publication Data
US 2006/0081918 A1    Apr. 20, 2006

(30) Foreign Application Priority Data
Oct. 18, 2004    (TW) ............................... 93131533 A

(51) Int. Cl.
*H01L 21/336* (2006.01)
(52) U.S. Cl. ...................... 438/270; 257/330
(58) Field of Classification Search ............... None
See application file for complete search history.

(56) References Cited

U.S. PATENT DOCUMENTS

| | | | |
|---|---|---|---|
| 6,455,379 B1 * | 9/2002 | Brush et al. ................. | 438/270 |
| 6,852,597 B1 * | 2/2005 | Park et al. ................... | 438/268 |

* cited by examiner

*Primary Examiner*—Thao P. Le
(74) *Attorney, Agent, or Firm*—Jiang Chyun IP Office

(57) ABSTRACT

A method for fabricating a trench power MOSFET, comprising an epitaxial layer and a mask layer formed over a substrate, a trench formed in the epitaxial layer and the mask layer, a gate oxide layer formed on the trench, then the mask layer removed, a body well region formed in the epitaxial layer beside the trench, a source region formed in and adjacent to the body well region, and a spacer formed on the sidewalls of the exposed gate layer exposing the source region partially. Masking by spacer, an opening exposing the body well is formed by partially removing the source region and the gate layer. A body region is formed in the body well region under the opening. A silicide layer is formed on the surfaces of the gate layer and the opening.

14 Claims, 7 Drawing Sheets

METHOD FOR FABRICATING A TRENCH POWER MOSFET

BACKGROUND OF THE INVENTION

1. Field of the Invention

The present invention relates to a power MOSFET (Metal Oxide Semiconductor Field Effect Transistor), and more particularly, to a trench power MOSFET (Metal Oxide Semiconductor Field Effect Transistor) and method for fabricating the power MOSFET.

2. Description of Related Art

A power MOSFET can be applied to be a high voltage device with the operation voltage up to over 4,500 volts. The methods for fabricating the conventional power device are similar to the general methods used for semiconductor fabrication, and its gate is formed on the surface of the silicon substrate, i.e. a planar gate. However, for the planar gate, the design of minimal gate length may hinder the increase of the device intensity. Therefore, the trench gate structure, which may greatly reduce the device size, has become the trend in power device fabrication.

FIGS. 1A–1I are the cross sectional views for the fabrication processes of the conventional trench power MOSFET (Metal Oxide Semiconductor Field Effect Transistor).

First, referring to FIG. 1A, a silicon oxide layer 104 is formed on the substrate 100 which contains an epitaxial layer 102.

Then, referring to FIG. 1B, the epitaxial layer 102 and the silicon oxide layer 104 are patterned, in order to form a trench 106.

The following step, referring to FIG. 1C, an etching process is undertaken to remove the silicon oxide layer 104. Thereafter, a gate oxide layer 108 is formed to cover the surfaces of the epitaxial layer 102 and the trench 106. Then, a polysilicon 110 is formed to fill in the trench 106.

Referring to FIG. 1D, an etching back process is undertaken to remove a part of the polysilicon layer 110 until the gate oxide layer 108 is exposed. The filled polysilicon 110a inside the trench 106 functions as the gate electrode for the trench power MOSFET. Later on, an ion implantation process is performed to form the body well region 112 between both sides of the trench 106 and inside the epitaxial layer 102 (as shown in FIG. 1E).

Then, referring to FIG. 1F, after forming a photoresist layer (not shown) on the substrate 100 and defining the photoresist layer, a patterned photoresist layer 114 is formed.

Please further referring to 1G, the patterned photoresist layer 114 is used as a mask for ion implantation to form the source region 116. Later on, the patterned photoresist layer 114 is removed and a dielectric layer 118 is formed over the substrate 100.

Referring to FIG. 1H, a photolithography etching process is carried out to remove a part of the dielectric layer 118 to form a contact opening 120 inside the dielectric layer 118. In addition, the contact opening 120 exposes a portion of the surface of the body well region 112 that is preserved for the body region.

Finally, referring to FIG. 1I, the dielectric layer 118a is used as a mask for ion implantation to form the body region 122 inside the body well region 112.

In previous mentioned fabrication process for the trench power MOSFET, in order to form the source region 116, it is necessary to form the patterned photoresist layer 114 on the substrate 100 (as shown in FIG. 1F) and the patterned photoresist layer 114 is used as a mask for ion implantation to form the source region 116 inside the body well region 112. However, following demands for higher integration, the critical dimension (CD) of the device becomes smaller. The previously mentioned patterned photoresist layer 114 may collapse or peel due to its small size, which further leads to deviation of the defined pattern. Besides, during the formation of the source region 116, the patterned photoresist layer 114 can easily be damaged by high current implantor during the ion implementation process, which can cause errors for definition.

In addition, if over-etching happens to the polysilicon layer 110 during the etching back process for removing a part of the polysilicon layer 110 (as shown in FIG. 1D), dopants may be implanted from the sidewalls of the trench during the following ion implantation process for the formation of the source region 116, thus leading to current leakage.

Besides, if misalignment occurs during the process for defining the photoresist layer, the subsequently formed source region 116 will be asymmetric.

Furthermore, during the formation of the contact window opening 120 (as shown in the FIG. 1H), misalignment is likely to happen, which causes abnormal electrical connection and reduce the reliability of devices.

SUMMARY OF THE INVENTION

As mentioned previously, the present invention relates to a method of fabricating the trench power MOSFET (Metal Oxide Semiconductor Field Effect Transistor), through which the problems of asymmetric source region is avoided and the on-off response rate for the transistors is improved.

In accordance with one aspect of the present invention, the method to fabricate a trench power MOSFET (Metal Oxide Semiconductor Field Effect Transistor) is provided. An epitaxial layer and mask layer are formed on the substrate, sequentially. Then, at least a trench is formed in the mask layer and the epitaxial layer and a gate oxide layer is formed to cover the surface of the trench. After the trench is filled with the gate layer, the mask layer is removed and the top surface of the gate layer is higher than the surface of the epitaxial layer. Then, the body well region is formed between both sides of the trenches and the source region is further formed within the body well region and adjacent to the top surface of the body well region. Thereafter, a spacer is formed aside the sidewalls of the exposed gate layer and a portion of the source region is exposed. Furthermore, the spacer is used as a mask for removing a part of the source region to form an opening that exposes a portion of the body well region, and simultaneously to remove a part of the gate layer. Finally, a body region is formed below the opening and inside the body well region, and a metal silicide is formed on the surfaces of the opening and the exposed gate layer.

According to the preferred embodiment of the present invention, the method of forming the previous mentioned metal silicide on the surfaces of the opening and the exposed gate layer can include forming a metal layer over the substrate conformally covering the spacer, the gate layer and the opening, performing a thermal process is to enable reactions between the metal layer and the underlying layers, and removing the un-reacted metal layer. Wherein, the material for the metal layer can be titanium (Ti), cobalt (Co), or nickel (Ni). Besides, the thermal process comprises a rapid thermal annealing and the method of removing the un-reacted metal layer comprises isotropic etching.

According to the preferred embodiment of the present invention, the method to form the spacer comprises forming a spacer material layer over the substrate to cover the source region and the gate layer and performing an anisotropic etching process to remove a part of the spacer material to form the spacer on the side walls of the exposed gate layer, thus exposing a part of the source region. The material for the spacer can be silicon nitride.

According to the preferred embodiment of the present invention, after the formation of the previous mentioned metal silicide, a dielectric layer is further formed upon the substrate and a patterning process is performed to form a contact opening inside the dielectric layer. The contact opening exposes the metal silicide layer within the opening. Where the material for the mentioned dielectric layer can be silicon oxide, silicon nitride, phosphosilicate glass or borophosphosilicate glass.

According to the preferred embodiment of the present invention, if the dielectric layer is made of borophosphosilicate glass, the dielectric layer is formed over the substrate by chemical vapor deposition, and then densification is performed to the dielectric layer.

According to the preferred embodiment of the present invention, the method for forming the body well region as mentioned previously, comprises ion implantation.

According to the preferred embodiment of the present invention, method for forming the body region as mentioned previously, comprises ion implantation.

According to the preferred embodiment of the present invention, materials for forming the mask layer comprises silicon oxide, silicon nitride, phosphosilicate glass and borophosphosilicate glass.

According to the preferred embodiment of the present invention, method for forming the gate oxide layer, comprises thermal oxidation.

The present invention also provides a trench metal oxide semiconductor field effect transistor (MOSFET). The structure comprises a substrate, an epitaxial layer, a gate oxide layer, a gate layer, at least a spacer, at least a body well region, at least a source region, at least a body region and a metal silicide layer. The epitaxial layer is located over the substrate and at least a trench is disposed inside the epitaxial layer. The gate oxide layer is disposed on the surface of the trench and the trench is filled with the gate layer. The body well region is located between two sides of the adjacent trenches and in the epitaxial layer. Besides, the source region is located in the body well region and adjacent to the top surface of the body well region. The spacer is disposed above the source region, while the body region is disposed between and below the source region and in the body well region. In addition, the metal silicide layer is located on the surfaces of the gate layer, sidewalls of the source drain and the body region.

According to the preferred embodiment of the present invention, materials for forming the metal silicide layer can be silicon titanium, silicon cobalt, or silicon nickel.

According to the preferred embodiment of the present invention, materials for forming the gate layer comprise polysilicon.

In conclusion, the gate layer of the present invention replaces the conventional patterned photoresist layer as a mask for ion implantation to form the source region. Therefore, the present invention can prevent the prior problems by using the patterned photoresist layer. Beside, there is no asymmetric problem for the source region by using the spacer as a mask for the etching process.

In addition, while defining the contact opening, the spacer can effectively protect the source region and allows a bigger process window for the etching process, so that the self-aligned contact opening is formed. Besides, the metal silicide layer is formed on the surfaces of the gate layer and the exposed opening can reduce the gate electric resistance and improve the on-off response rate of the devices. At the same time, the contact resistance and the connect resistance (Rdson) are both reduced, and the reliability of the device is improved.

DESCRIPTION OF THE EMBODIMENTS

Figure 1A:
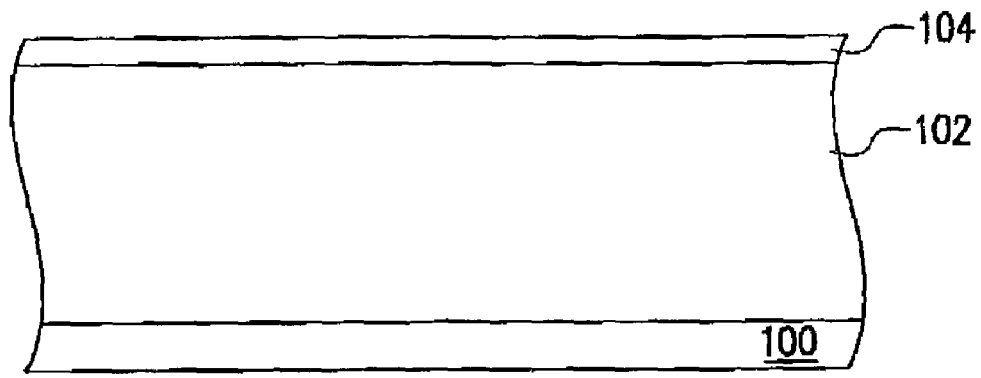
FIGS. 1A to 1I are cross sectional views for the manufacture process of the trench power metal oxide semiconductor field effect transistor (MOSFET).
Figure 1B:
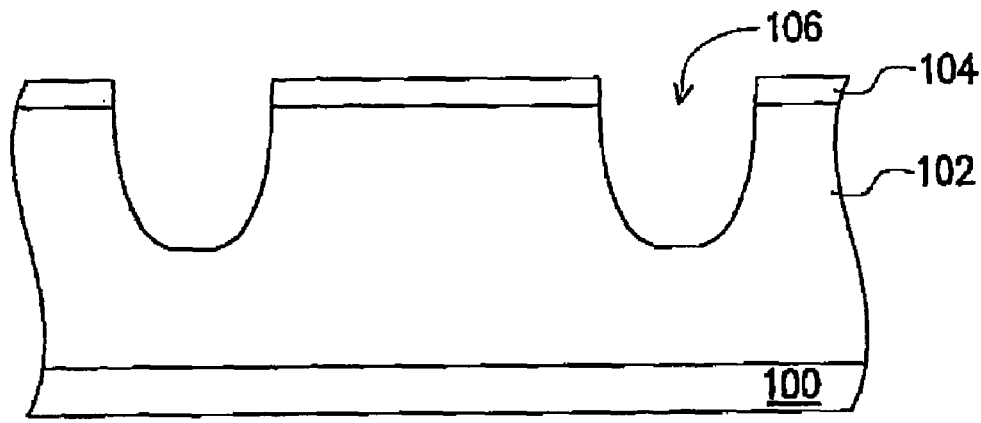
Figure 1C:
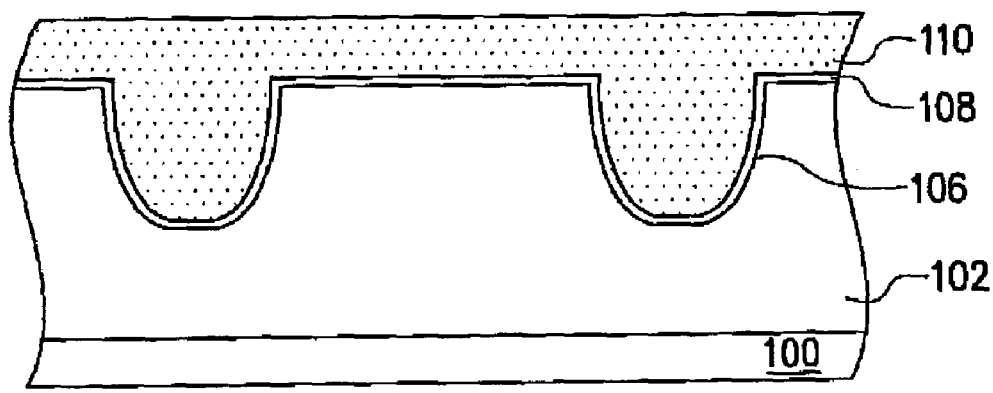
Figure 1D:
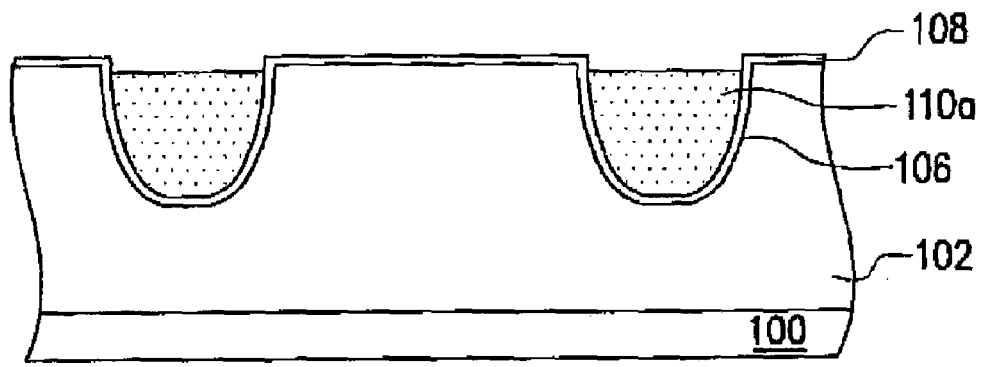
Figure 1E:
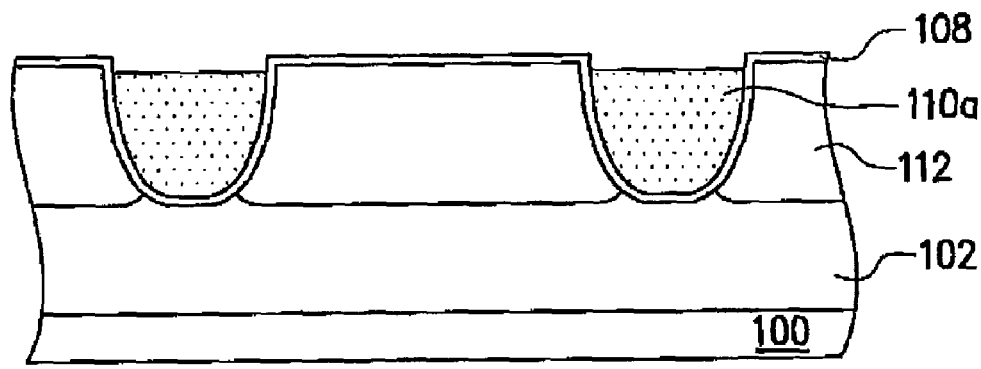
Figure 1F:
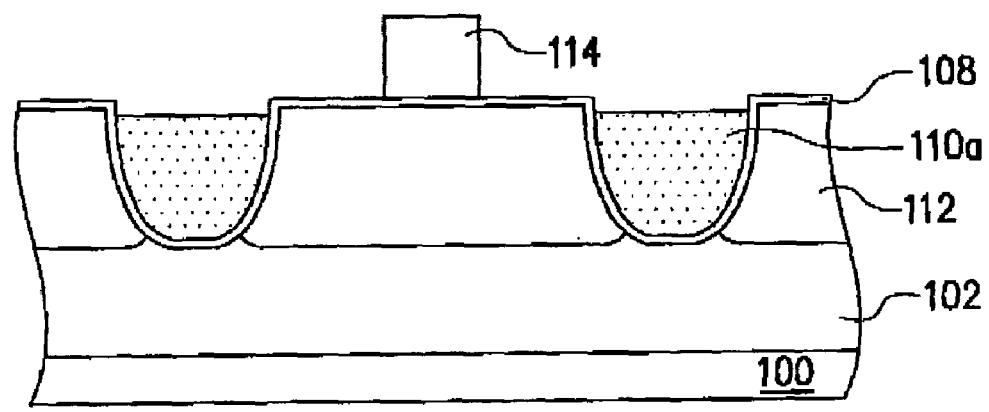
Figure 1G:
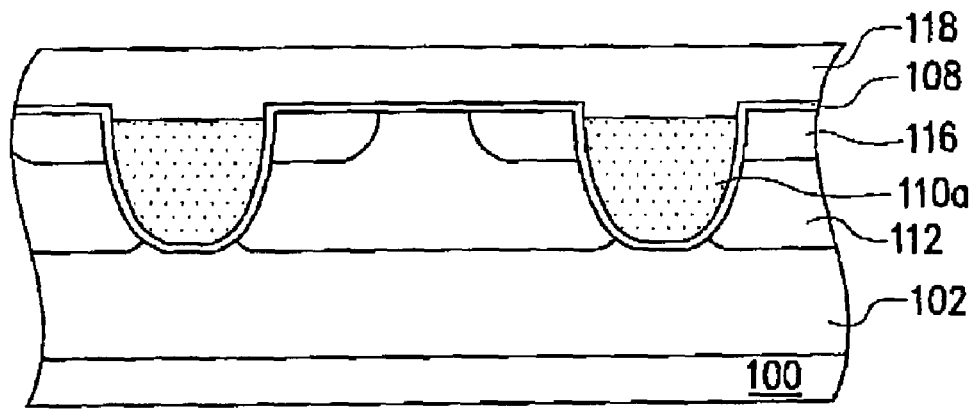
Figure 1H:
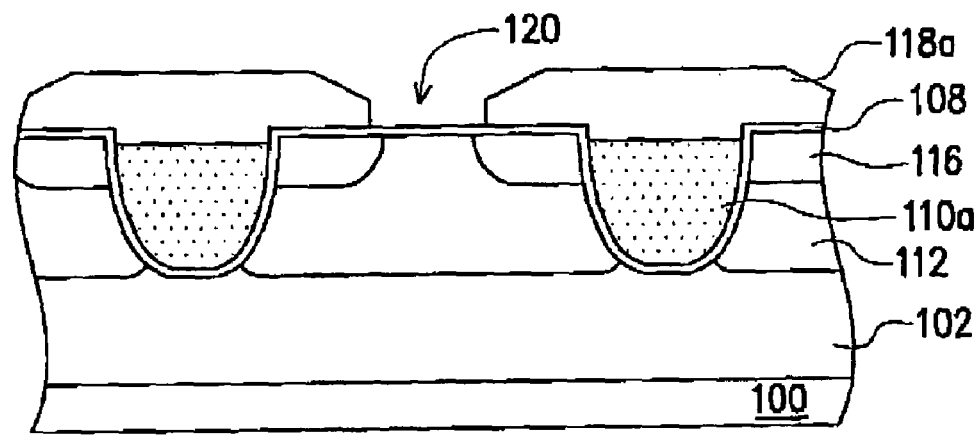
Figure 1I:
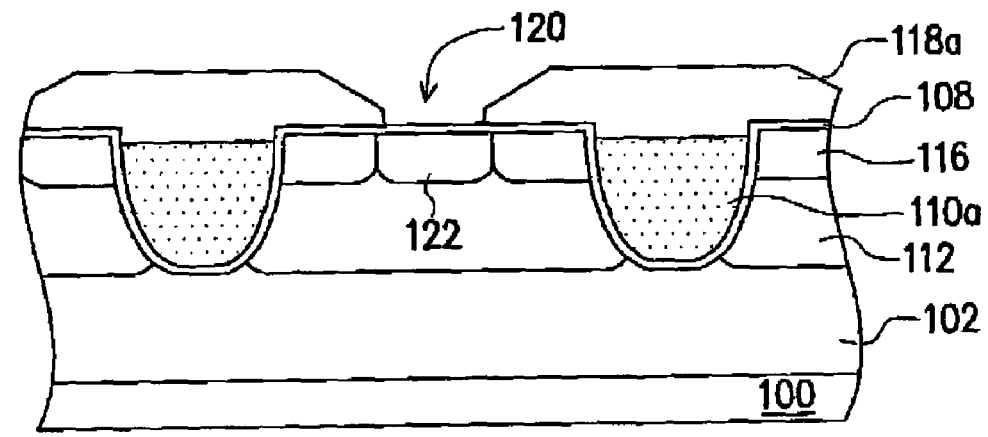

Reference will now be made in detail to the present preferred embodiments of the invention, examples of which are illustrated in the accompanying drawings. Wherever possible, the same reference numbers are used in the drawings and the description to refer to the same or like parts.

The embodiment of the present invention is explained by an n-type doping substrate, an n-type epitaxial layer, a p-type body well region and an n-type power MOSFET. However, the modification and adoption can be made for the practical application, and the embodiment is not used to limit the present invention.

FIGS. 2A to 2J are cross sectional view of the fabrication process for the trench power MOSFET, according to the preferred embodiment of the present invention.

Figure 2A:
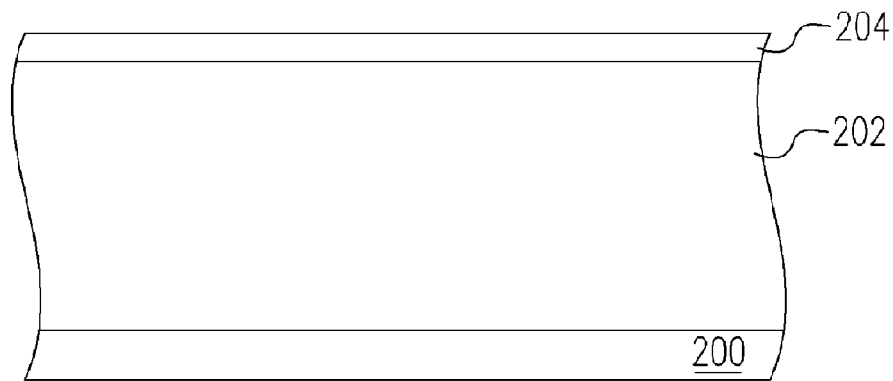
FIGS. 2A to 2K are cross sectional views for the manufacture process of the trench power MOSFET according to the preferred embodiment of the present invention.

First, referring to FIG. 2A, a substrate 202 with an epitaxial layer 202 is provided, and the material for the epitaxial layer 202 can be, for example, an n-type doping silicon with a lower doping concentration than the concentration in the substrate 200. Thereafter, a mask layer 204 is formed over the substrate 200, and the material for the mask layer 204 can be, for example, silicon oxide, silicon nitride, silicon oxygen nitride, or other suitable materials, by using chemical vapor deposition or other appropriate method.

Figure 2B:
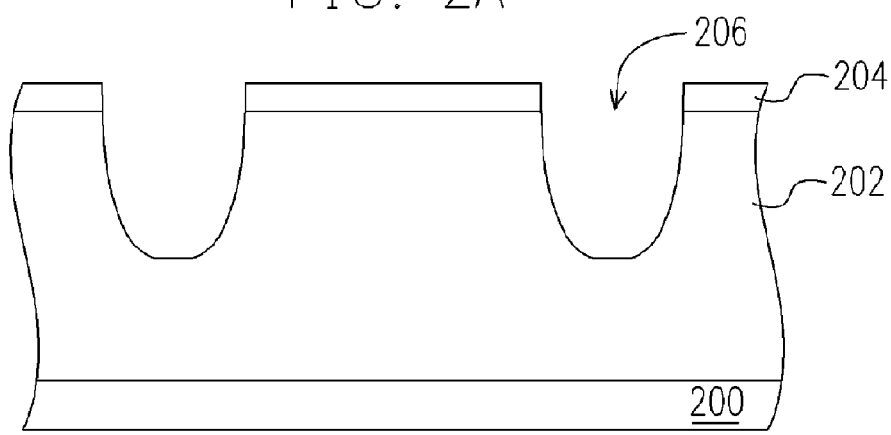

Then, referring to FIG. 2B, the mask layer 204 and the epitaxial layer 202 are patterned to form at least one trench 206. The methods for patterning the mask layer 204 and the epitaxial layer 206 can include the photolithography and etching process.

Figure 2C:
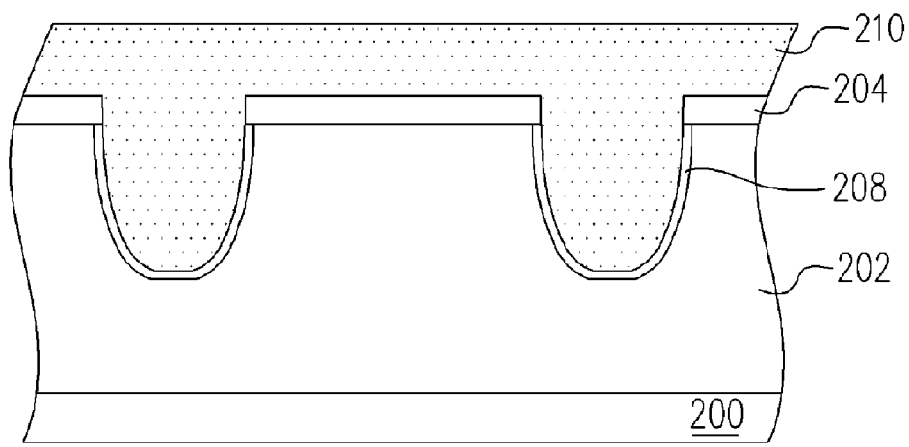

Thereafter, referring to FIG. 2C, a gate oxide layer 208 is formed on the surface of the trench 206, and the material for the gate oxide layer 208 can be, for example, silicon oxide or other appropriate materials by thermal oxidation or other suitable methods. Then, a gate layer 210 is formed over the substrate 200, and the material for the gate layer 210 is, for example, polysilicon or other suitable materials, and the formation method is, for example, chemical vapor deposition or other appropriate methods.

Figure 2D:
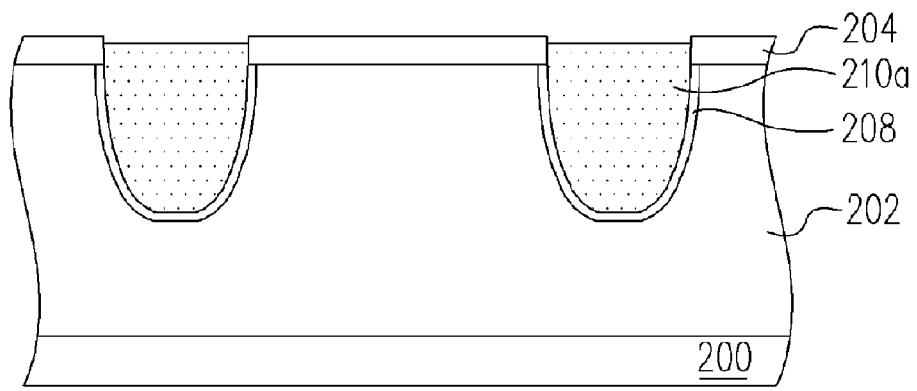

Later on, referring to FIG. 2D, a part of the gate layer 210 is removed until the surface of the mask layer 204 is exposed to form a gate layer 210a and the method of remove a part of the gate layer 210 can include, for example, etching back or other suitable methods.

Figure 2E:
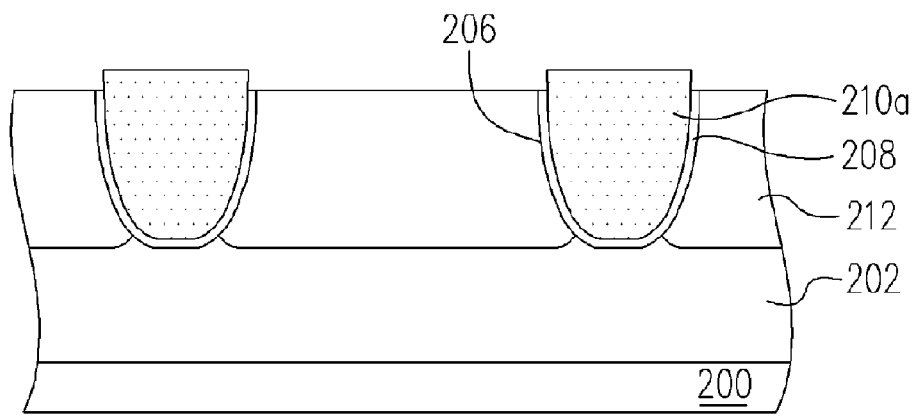

The following step referring to FIG. 2E, the mask layer 204 is removed, so that the top surface of the gate layer 210a is higher than the surface of the epitaxial layer 202. Then, the body well region 212 is formed in the epitaxial layer 202 and between two sides of the adjacent trenches 206, and the method for forming the body well region 212 may include ion implantation. Taking the epitaxial layer 202 being n-type doping as an example, the p-type boron is preferred for ion implantation in the previously mentioned process for forming the body well region 212. The gate layer 210a is used as a mask for ion implantation to form the body well region 212.

Figure 2F:
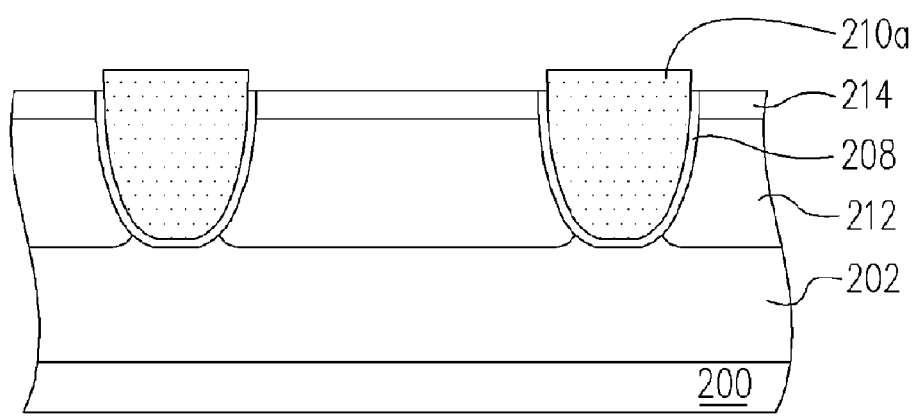
Figure 2G:
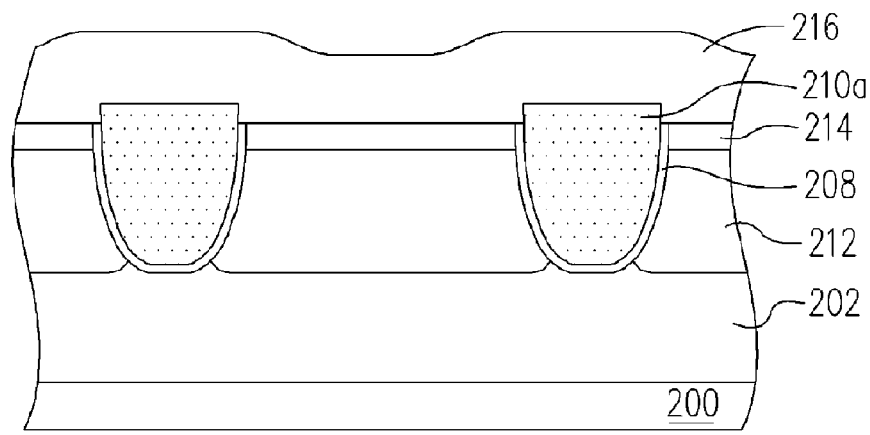
Figure 2H:
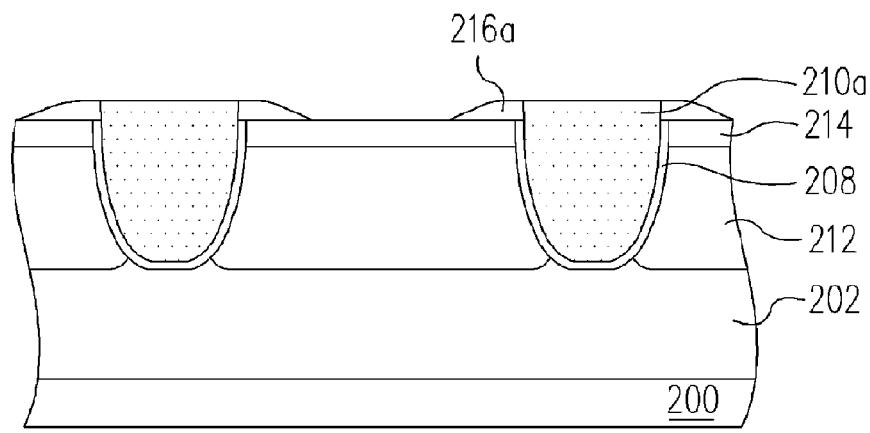

Then, referring to the FIG. 2F, at least a source region 214 is formed inside the body well region 212 and next to the top surface of the body well region 212. The gate layer 210a is as also considered as a mask for ion implantation to form the source region 214.

Particularly, after the removal of the mask layer 204, the top surface of the gate layer 210a is higher than the surface of the epitaxial layer 202. During the formation of the source regions 214, the gate layer 210a used as a mask for forming the source region 214 can avoid dopants implanted from the sidewalls of the trenches. Therefore, the prior problems of current leakage can be alleviated.

Thereafter, spacers are formed on the sidewalls of the exposed gate layer 210a. The method of forming the spacers will be described in details as the following. First, referring to FIG. 2G, a spacer material layer 216 is formed over the substrate 200. And the material for the spacer material layer 216 is, for example, silicon nitride or the other suitable materials, formed by, for example, chemical vapor deposition or other suitable methods. Thereafter, an anisotropic etching process is performed to remove a part of the spacer material layer 216 and spacers 216a are formed on the sidewalls of the exposed gate layers 210a (as shown in the FIG. 2H), while a part of the source regions 214 is exposed.

Figure 2I:
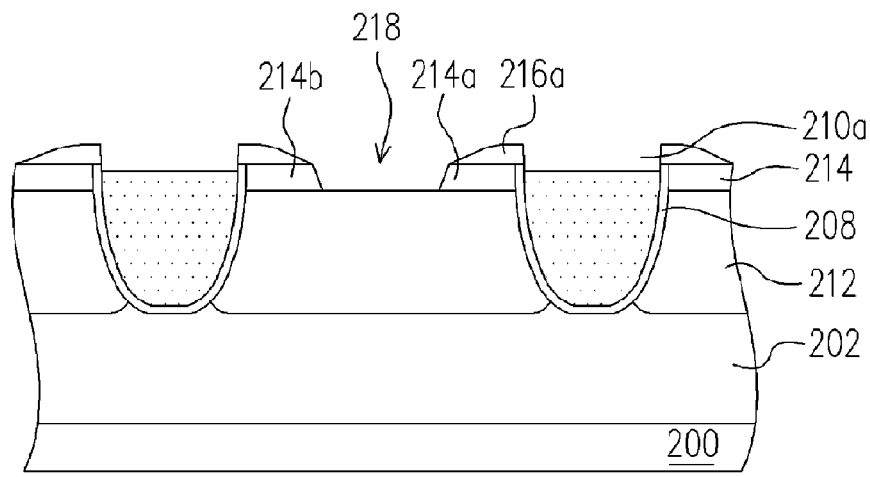

Referring to FIG. 2I, by using the spacers 216a as masks, a part of the source regions 214 is removed to form the source regions 214a, 214b and the openings 218. Simultaneously, a part of the gate layer 210a is removed. Since the openings 218 are formed by using the spacers 216a as masks, they can hence be considered as self-aligned openings. Besides, by using the spacers 216a as masks, the source region 214a and the source region 214b separated by the opening 218 should be symmetric. Therefore, the asymmetric problems can be avoided.

Then, referring to FIG. 2J, at least a body region 220 is formed below the opening 218, between the source region 214a and the source region 214b, and in the body well region 212 by, for example, ion implantation. Thereafter, a metal silicide layer 222 is formed on the surfaces of the opening 218 and the exposed gate layer 210a. The method of forming the metal silicide layer 222, for example, includes forming a metal layer (not shown) over the substrate 200 and conformally covering the spacers 216a, the gate layer 210a and the opening 218. And the material for the metal layer can be, for example, titanium (Ti), cobalt (Co), or nickel (Ni) or other suitable materials. The next step is to carry out a thermal process to enable reactions between the metal layer and the underlying layer. The thermal process is, for example, a rapid annealing process. Thereafter, the un-reacted metal layer is removed, leaving the metal silicide layer 222 on the surfaces of the exposed gate layer 210a and the opening 218. The method of removing the un-reacted metal can be, for example, isotropic etching or other appropriate methods.

Additionally, after completing the processes of the trench power MOSFET, the process for the contact opening can be further performed to enable the electrical connection for the source region 116 and the body region 122 of the transistor. The details will be explained as the following.

Figure 2J:
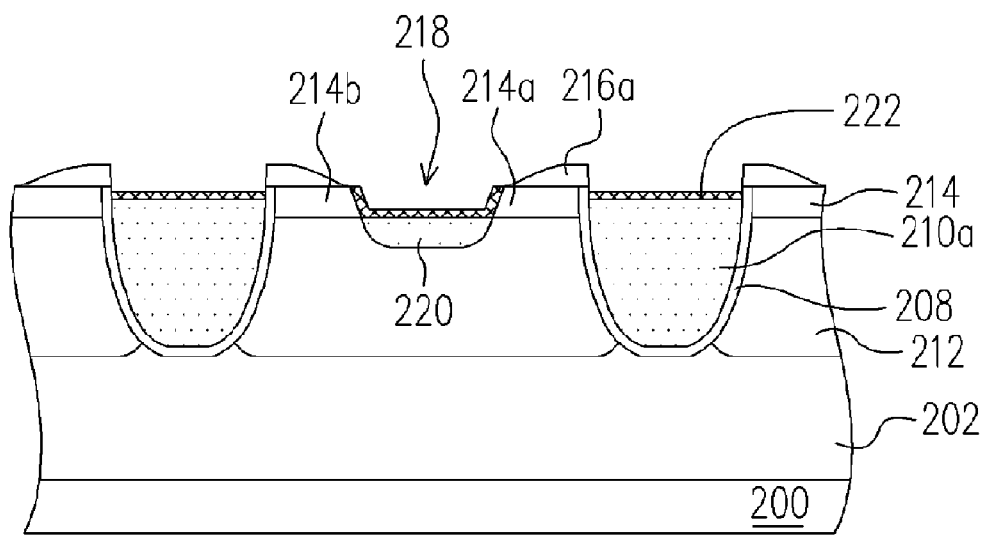
Figure 2K:
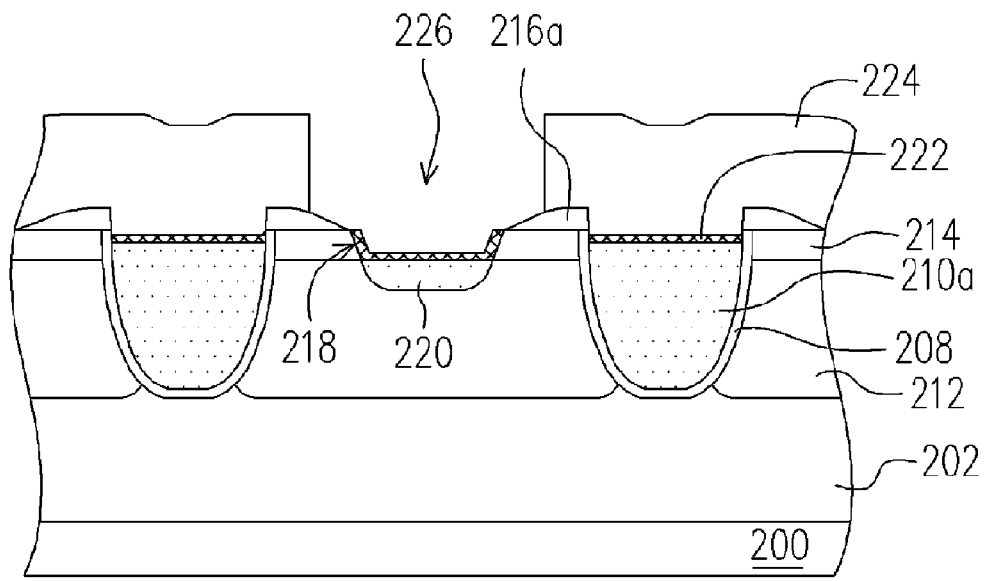

Referring to FIG. 2K, a dielectric layer 224 is formed over the substrate 200, then the contact openings 226 are formed in the dielectric layer 224, and the contact opening 226 exposes the metal silicide layer 222 in the opening 218. The materials for the dielectric layer 224 can be, for example, silicon oxide, silicon nitride, phosphosilicate glass or borophosphosilicate glass or other suitable materials. If the dielectric layer 224 is formed by borophosphosilicate glass, the dielectric layer made of borophosphosilicate glass can be formed by chemical vapor deposition and then densification.

During the process of defining the contact opening 226, the spacers 216a can effectively protect the source region 214 and allow a bigger process window for etching process. Therefore, the contact opening 226 is wider, which will benefit the following formation of the conducting layer by avoiding poor step coverage for the contact opening, and improve the electrical connection between the source region 214 and the body region 220.

The following description is to explain the structure of the trench power metal oxide semiconductor field effect transistor obtained from the mentioned method.

Please further referring to FIG. 2J, the structure of the trench power metal oxide field effect transistor comprises a substrate 200, an epitaxial layer 202, a gate oxide layer 208, a gate layer 210a, at least a body well region 212, at least a source region 214a, at least a body region 220 and a metal silicide layer 222.

The epitaxial layer 202 is disposed on the substrate 200, and at least a trench 206 is disposed inside the epitaxial layer 202. Besides, the gate oxide layer 208 is located on the inner surface of the trench 206 and the gate layer 210a is disposed within and fills the trench 206. The body well region 212 is disposed between both sides of the adjacent trenches 216 and in the epitaxial layer 202.

Besides, the source regions 214a,b are located at both sides of the trench 216 and inside the body well region 212. And the source regions 214a,b are adjoined to the top surface of the body well region 212 and the depth of the source region is smaller than that of the trench. The body region 220 is located between two adjacent source regions, between two sides of the adjacent trenches 216 and inside the body well region 212. And, the metal silicide layer 222 is located on the surfaces of the gate layer 210a, sidewalls of the source regions 214a,b and the body region 220. In addition, the material of the spacer 216a is, for example, silicon nitride, the material of the gate oxide 208 is, for example, silicon oxide, and the material of the gate layer is, for example, polysilicon.

On the other side, the material for the metal silicide layer can be, for example, silicon titanium, silicon cobalt, or silicon nickel. In the present invention, the metal silicide is formed on the gate layer 210a to reduce the gate resistance and improve the on-off response rate. At the same time, the metal silicide layer 222 also reduces contact resistance and connect resistance.

In conclusion of the above mentioned for the present invention, by using the gate layer 210a as a mask for ion implantation in order to form the source region 214, it is not necessary to apply a patterned photoresist layer as a mask to form a source region in the present invention. Therefore, the present invention can prevent the prior problems by using the patterned photoresist layer.

In addition, in the present invention, since the spacers are used as masks to form source regions in the body well region 212 (as shown in the FIG. 2I and the source region 214a and the source region 214b), the resultant source regions are symmetric, which will benefit the following processes.

Besides, in the present invention, a metal silicide 222 is formed on the surfaces of the gate layer and the body region 220 to reduce the gate resistance and to improve the on-off response rate of the device. At the same time, the contact resistance and connecting resistance are both reduced to improve the reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a trench power MOSFET, comprising:
    forming an epitaxial layer and a mask layer on the substrate subsequently;
    forming a trench in the mask layer and the epitaxial layer;
    forming a gate oxide layer on a surface of the trench;
    forming a gate layer to fill the trench;
    removing the mask layer, so that a top surface of the gate layer is higher than that of the epitaxial layer;
    forming a body well region at both sides of the trench and in the epitaxial layer;
    forming a source region adjoined to a surface of the body well region and in the body well region;
    forming a spacer on sidewalls of the exposed gate layer, while a portion of the source region is exposed;
    removing a portion of the source region by using the spacer as a mask to form an opening, exposing a portion of the body well region, while a portion of the gate layer is removed at the same time;
    forming a body region below the opening and inside the body well region, and
    forming a metal silicide layer on surfaces of the opening and the gate layer.

2. The method as recited in claim 1, wherein the step of forming the metal silicide comprises:
    forming a metal layer conformally covering the spacer, the gate layer and the opening;
    performing a thermal process to the metal layer to enable reactions between the metal layer and the underlying layer; and
    removing the un-reacted metal layer.

3. The method as recited in claim 2, wherein the metal layer comprises a material selected from the group consisting of titanium, cobalt, and nickel.

4. The method as recited in claim 2, wherein a method for the thermal process comprises rapid annealing.

5. The method as recited in claim 2, wherein a method for removing the un-reacted metal layer comprises isotropic etching.

6. The method as recited in claim 1, wherein the step of forming the spacer comprises:
    forming a spacer material layer over the substrate to cover the source region and the gate layer; and
    performing an isotropic etching process to remove a portion of the spacer material layer to form the spacer on the sidewalls of the gate layer.

7. The method as recited in claim 1, wherein a material for the spacer comprises silicon nitride.

8. The method as recited in claim 1, after formation of the metal silicide layer, further comprising:
    forming a dielectric layer over the substrate; and
    performing a patterning process to form a contact opening, wherein the contact opening exposes the metal silicide layer.

9. The method as recited in claim 8, wherein the dielectric layer comprises a material selected from the group consisting of silicon oxide, silicon nitride, phosphosilicate glass and borophosphosilicate glass.

10. The method as recited in claim 8, wherein if the dielectric layer is made of borophosphosilicate glass, a method of forming the dielectric layer comprises:
    forming the dielectric layer over the substrate by chemical vapor deposition; and
    performing a densification process to the dielectric layer.

11. The method as recited in claim 1, wherein the step of forming the body well region comprises ion implantation.

12. The method as recited in claim 1, wherein the step of forming the body region comprises ion implantation.

13. The method as recited in claim 1, wherein the mask layer comprises a material selected from the group consisting of silicon oxide, silicon nitride, and silicon oxynitride.

14. The method as recited in claim 1, wherein the step of forming the gate oxide layer comprises thermal oxidation.

* * * * *